(12) United States Patent
Yamazaki

(10) Patent No.: US 12,278,620 B2
(45) Date of Patent: Apr. 15, 2025

(54) LADDER FILTER AND COMPOSITE FILTER DEVICE

(71) Applicant: Murata Manufacturing Co., Ltd., Nagaokakyo (JP)

(72) Inventor: Sunao Yamazaki, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 497 days.

(21) Appl. No.: 17/567,920

(22) Filed: Jan. 4, 2022

(65) Prior Publication Data

US 2022/0131528 A1 Apr. 28, 2022

Related U.S. Application Data

(63) Continuation of application No. PCT/JP2020/025300, filed on Jun. 26, 2020.

(30) Foreign Application Priority Data

Jul. 5, 2019 (JP) ................................ 2019-125775

(51) Int. Cl.
*H03H 9/56* (2006.01)
*H03H 9/13* (2006.01)
*H03H 9/54* (2006.01)

(52) U.S. Cl.
CPC .............. *H03H 9/568* (2013.01); *H03H 9/13* (2013.01); *H03H 9/542* (2013.01)

(58) Field of Classification Search
CPC ........... H03H 9/542; H03H 9/13; H03H 9/568

USPC .......................... 333/132–135, 186, 190–193
See application file for complete search history.

(56) References Cited

U.S. PATENT DOCUMENTS

| 2014/0167877 | A1* | 6/2014 | Shimizu ................. H03H 7/463 333/101 |
| 2016/0191012 | A1* | 6/2016 | Khlat .................... H03H 9/6483 333/195 |
| 2017/0244382 | A1  | 8/2017 | Lear |
| 2018/0226952 | A1  | 8/2018 | Tanaka et al. |
| 2020/0412336 | A1* | 12/2020 | Hanaoka ................. H03H 9/70 |

FOREIGN PATENT DOCUMENTS

| EP | 1 058 334 A2 | 12/2000 |
| JP | 2000-349508 A | 12/2000 |
| JP | 2010-087586 A | 4/2010 |
| JP | 2018-129680 A | 8/2018 |
| WO | 2018/003268 A1 | 1/2018 |

OTHER PUBLICATIONS

Official Communication issued in International Patent Application No. PCT/JP2020/025300, mailed on Sep. 8, 2020.

* cited by examiner

*Primary Examiner* — Rakesh B Patel
(74) *Attorney, Agent, or Firm* — Keating & Bennett, LLP

(57) ABSTRACT

A ladder filter includes series arm resonators, parallel arm resonators, and first and second inductors. Second ends of the parallel arm resonators are connected in common to each other and are connected to a ground potential. A first end of each of the first and second inductors is connected to a series arm, and second ends thereof are connected in common to each other and are connected to the ground potential with a capacitor therebetween.

9 Claims, 2 Drawing Sheets

LADDER FILTER AND COMPOSITE FILTER DEVICE

CROSS REFERENCE TO RELATED APPLICATIONS

This application claims the benefit of priority to Japanese Patent Application No. 2019-125775 filed on Jul. 5, 2019 and is a Continuation Application of PCT Application No. PCT/JP2020/025300 filed on Jun. 26, 2020. The entire contents of each application are hereby incorporated herein by reference.

BACKGROUND OF THE INVENTION

1. Field of the Invention

The present invention relates to a ladder filter and a composite filter device.

2. Description of the Related Art

Various band-pass filters are used in an RF stage in communication equipment, such as a smartphone. One example of such band-pass filters is disclosed in Japanese Unexamined Patent Application Publication No. 2010-87586. In the band-pass filter described in Japanese Unexamined Patent Application Publication No. 2010-87586, a filter circuit is connected between an antenna terminal and a signal terminal. In a line including the antenna terminal and the signal terminal, an end portion of the filter circuit nearer the antenna terminal is connected to one end of a first inductor. In a line between the filter circuit and the signal terminal, the filter circuit is connected to one end of a second inductor. The other ends of the first and second inductors are connected in common to each other and are connected to a ground potential with a third inductor disposed therebetween.

In the band-pass filter described in Japanese Unexamined Patent Application Publication No. 2010-87586, the first inductor and the second inductor are connected in common and are connected to the ground potential. Thus, an attenuation pole is provided in a range lower than its pass band. Accordingly, the attenuation in a frequency range lower than the pass band can be increased.

Further, a composite filter device for carrier aggregation has been used in an RF stage in a smartphone or the like in recent years. The composite filter device includes many band-pass filters having various pass bands. Each of the band-pass filters used in such a composite filter device is required to have sufficiently large attenuations in the pass bands of the other band-pass filters.

For the band-pass filter described in Japanese Unexamined Patent Application Publication No. 2010-87586, however, it is difficult to meet that requirement.

In addition, the pass band for one band-pass filter may be very remote from the pass band for another band-pass filter. In that case, it is necessary to ensure a sufficient attenuation in the frequency range very remote from the pass band. For the band-pass filter described in Japanese Unexamined Patent Application Publication No. 2010-87586, it is also difficult to meet that need.

SUMMARY OF THE INVENTION

Preferred embodiments of the present invention provide ladder filters and composite filter devices each of which provides a sufficient attenuation in a frequency range different from its pass band, in particular, in a frequency range remote from its pass band.

A ladder filter according to a preferred embodiment of the present invention includes series arm resonators in a series arm connecting a first terminal and a second terminal, a first inductor in a first parallel arm, a second inductor in a second parallel arm, the first parallel arm and the second parallel arm included in a plurality of parallel arms connecting the series arm and a ground potential, and parallel arm resonators disposed in parallel arms, respectively, included in the plurality of parallel arms and different from the first and second parallel arms. End portions of the first inductor and the second inductor nearer the ground potential are connected in common. The ladder filter further includes a capacitance connected between the ground potential and a section where the first inductor and the second inductor are connected in common.

In each of the ladder filters according to preferred embodiments of the present invention, a sufficient attenuation is able to be provided in each of a plurality of frequency ranges different from its pass band.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Preferred embodiments of the present invention are described below with reference to the drawings.

The preferred embodiments described in the present specification are illustrative and their configurations can be replaced or combined amongst different preferred embodiments.

Figure 1:
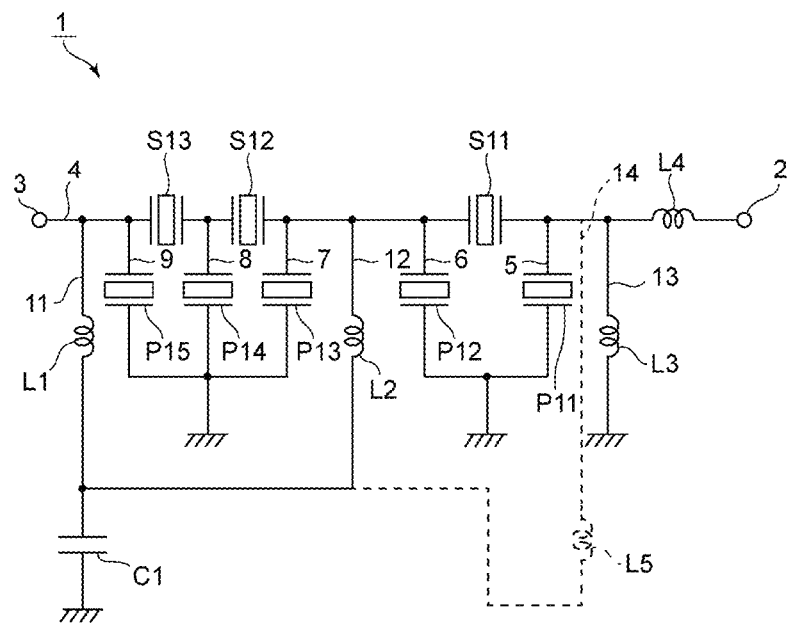
FIG. 1 is a circuit diagram of a ladder filter according to a first preferred embodiment of the present invention.

FIG. 1 is a circuit diagram of a ladder filter according to a first preferred embodiment of the present invention.

A ladder filter 1 includes an antenna terminal 2 as a second terminal and a reception terminal 3 as a first terminal. The ladder filter 1 is, for example, a reception filter for Band 41, and its pass band is, for example, about 2496 MHz to about 2690 MHz.

A plurality of series arm resonators S11 to S13 are provided in a series arm 4 connecting the antenna terminal 2 and the reception terminal 3.

Parallel arm resonators P11 to P15 are provided in a plurality of parallel arms 5 to 9, respectively, which connect the series arm 4 and a ground potential. First ends of the parallel arm resonators P11 and P12 are connected to the series arm 4. Second ends of the parallel arm resonators P11 and P12 are connected in common to each other and are connected to the ground potential. First ends of the parallel arm resonators P13 to P15 are connected to the series arm 4. Second ends of the parallel arm resonators P13 to P15 are connected in common to each other and are connected to the ground potential. Hereinafter, of each of the parallel arm resonators and inductors in the parallel arm, an end portion connected to the series arm is referred to as a first end, and an end portion nearer the ground potential is referred to as a second end.

A first inductor L1 is provided in a first parallel arm 11 connecting the series arm 4 and the ground potential. The first inductor L1 is electrically connected to the series arm 4 without the parallel arm resonator therebetween. A first end of the first inductor L1 is connected to the reception terminal 3 without the series arm resonators S11 to S13 therebetween.

A first end of a second parallel arm 12 is connected to the series arm 4 between the series arm resonators S11 and S12. The second parallel arm 12 connects the series arm 4 and the ground potential. A second inductor L2 is provided in the second parallel arm 12. The second inductor L2 is electrically connected to the series arm 4 without the parallel arm resonator therebetween. Second ends of the first inductor L1 and the second inductor L2 are connected in common to each other and are connected to the ground potential with a capacitor C1 disposed therebetween.

A first end of a third parallel arm 13 is connected to the series arm 4 between the series arm resonator S11 and the antenna terminal 2. The third parallel arm 13 is connected between the series arm 4 and the ground potential. A third inductor L3 is provided in the third parallel arm 13. A plurality of third parallel arms may be provided. Therefore, the third inductor L3 may be provided in each of one or more third parallel arms.

A fourth inductor L4 connected to the antenna terminal 2 is disposed in the series arm 4.

The ladder filter 1 has a circuit configuration including the plurality of series arm resonators S11 to S13 and the plurality of parallel arm resonators P11 to P15. Thus, its pass band is defined.

In the ladder filter 1, the second ends of the parallel arm resonator P11 and P12 are connected in common to each other and are connected to the ground potential. Moreover, the second ends of the parallel arm resonators P13 to P15 are connected in common to each other and are connected to the ground potential. In this circuit configuration, a first attenuation pole is provided in a frequency range lower than the pass band. Accordingly, a sufficiently large attenuation can be obtained in the portion where the first attenuation pole exists and its vicinity in the frequency range lower than the pass band.

On the other hand, the first inductor L1 and the second inductor L2 are connected in common and are connected to the ground potential with the capacitor C1 disposed therebetween. Accordingly, the combined inductor of the first inductor L1 and the second inductor L2 and the capacitor C1 define an LC resonant circuit. Thus, a second attenuation pole is provided. In this case, the frequency range of the second attenuation pole can be adjusted by adjustment in the inductance value of the combined inductor and the capacitance value of the capacitor C1.

Accordingly, in addition to the first attenuation pole based on the configuration in which the second ends of the parallel arm resonators P11 and P12 and the second ends of the parallel arm resonators P13 to P15 are connected to the ground potential, the second attenuation pole based on the LC resonant circuit can be provided. That is, a plurality of attenuation poles can be provided in a frequency range lower than the pass band. Accordingly, sufficiently large attenuations can be obtained in, for example, both of a range from about 1805 MHz to about 1880 MHz, which is the reception range in Band 3, and a range from about 925 MHz to about 960 MHz, which is the reception range in Band 8, in a frequency range lower than a range from about 2496 MHz to about 2690 MHz, which is the reception range in Band 41.

The position of the second attenuation pole can be easily adjusted by adjustment in the combined inductance value of the first inductor L1 and the second inductor L2 and the capacitance value of the capacitor C1.

Accordingly, the second attenuation pole can also be provided in a lower frequency range very remote from the pass band of the ladder filter 1 by adjustment in the inductance value of the combined inductor and the capacitance value of the capacitor C1. Therefore, when the ladder filter 1 is used as a band-pass filter whose pass band is a relatively high frequency range in a composite filter device, a sufficiently large attenuation can be obtained in a pass band of another band-pass filter whose pass band is a very remote lower frequency range.

Example of the ladder filter 1 according to the above-described preferred embodiment was produced. The design parameters are described below.

The design parameters for the series arm resonators S11 to S13 are shown in Table 1.

The design parameters for the parallel arm resonators P11 to P15 are shown in Table 2.

A piezoelectric substrate includes a support substrate: Si

A high acoustic velocity member: a SiN film with a thickness of about 900 nm

A low acoustic velocity film: a $SiO_2$ film with a thickness of about 673 nm

A piezoelectric film: a LT film with a thickness of about 600 nm and a cut angle of about 42°.

Material of electrodes: an AlCu film having a thickness of about 100 nm

TABLE 1

| | | | |
|---|---|---|---|
| IDT WAVELENGTH [μm] | 1.428 | 1.462 | 1.424 |
| INTERSECTING WIDTH [μm] | 23.8 | 24.31 | 21.09 |
| NUMBER OF PAIRS OF IDT | 217 | 216 | 159 |
| NUMBER OF REF | 15 | 10 | 5 |
| IDT DUTY | 0.45 | 0.45 | 0.45 |
| REF DUTY | 0.45 | 0.45 | 0.45 |

TABLE 2

| | | | | | |
|---|---|---|---|---|---|
| IDT WAVELENGTH [μm] | 1.583 | 1.569 | 1.568 | 1.556 | 1.592 |
| INTERSECTING WIDTH [μm] | 15.17 | 16.21 | 28.88 | 26.11 | 13.85 |
| NUMBER OF PAIRS OF IDT | 101 | 109 | 137 | 174 | 93 |
| NUMBER OF REF | 10 | 10 | 5 | 10 | 10 |
| IDT DUTY | 0.45 | 0.45 | 0.45 | 0.45 | 0.45 |
| REF DUTY | 0.45 | 0.45 | 0.45 | 0.45 | 0.45 |

The inductance values of the first inductor L1 to the fourth inductor L4 are shown in Table 3 below. The capacitance of the capacitor C1 is about 50 pF.

TABLE 3

|  | L1 | L2 | L3 | L4 |
|---|---|---|---|---|
| INDUCTANCE VALUE [nH] | 1.0 | 4.0 | 2.0 | 1.0 |

A ladder filter according to Comparative Example was produced in the same or substantially the same way as that for Example, except that, for comparison, the first inductor L1 and the second inductor L2 were not connected in common and were independently connected to the ground potential, the inductance value of the first inductor L1 was about 8.0 nH, and the inductance value of the second inductor L2 was about 2.0 nH.

Figure 2:
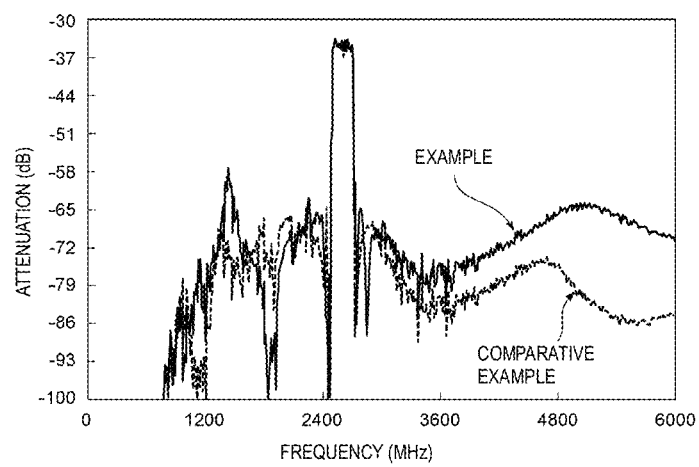
FIG. 2 illustrates the attenuation to frequency characteristics of ladder filters according to Example of a preferred embodiment of the present invention and Comparative Example.

FIG. 2 illustrates the attenuation to frequency characteristics of the ladder filters according to Example and Comparative Example.

As is clear from FIG. 2, the ladder filters according to Example and Comparative Example have fine filter characteristics in the range from about 2496 MHz to about 2690 MHz, which is their pass band.

On the other hand, in a frequency range lower than the pass band, in Comparative Example, a sufficient attenuation is provided in a range from about 1805 MHz to about 1880 MHz. In a range from about 925 MHz to about 960 MHz, however, the attenuation is small.

In contrast, in Example, sufficiently large attenuations are provided not only in the range from about 1805 MHz to about 1880 MHz, but also the range from about 925 MHz to about 960 MHz.

That is considered to be due to the improvement of the attenuation in the range from about 925 MHz to about 960 MHz resulting from the second attenuation pole based on the LC resonant circuit.

In the first preferred embodiment, the first inductor L1 is disposed in the first parallel arm 11 connecting the reception terminal 3 and the ground potential. That is, the end portion of the first inductor L1 nearer the series arm 4 is connected to the reception terminal 3 as the signal terminal without the series arm resonators S11 to S13 therebetween. The first inductor L1 and the second inductor L2 are not connected between the antenna terminal 2 and the ground potential. Accordingly, it is not necessary to consider the influence on impedance matching in the antenna terminal 2 when adjusting the inductance values of the first and second inductors L1 and L2 and the capacitance value of the capacitor C1 to define the second attenuation pole. Therefore, the frequency position and the attenuation of the second attenuation pole can be easily adjusted.

The first terminal may be, for example, a transmission terminal. In this case, a transmission filter can be provided.

Figure 3:
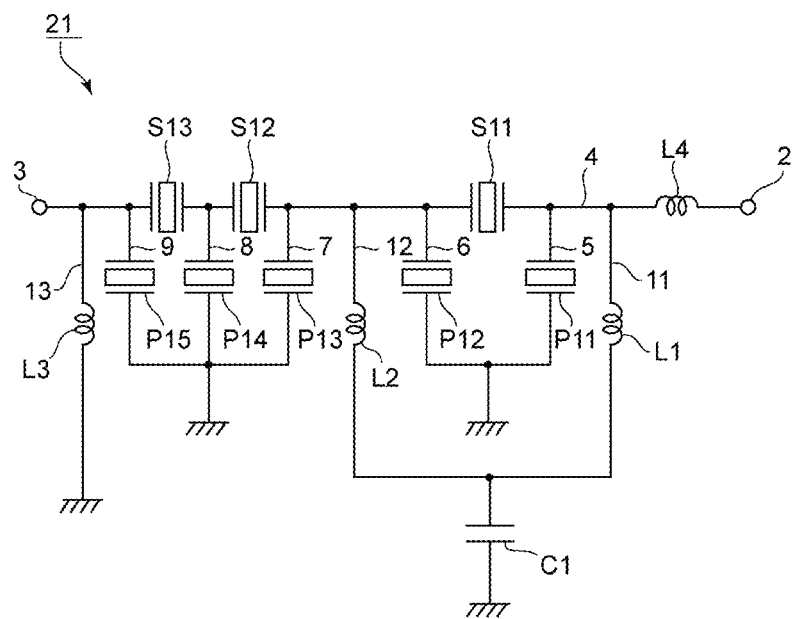
FIG. 3 is a circuit diagram of a ladder filter according to a second preferred embodiment of the present invention.

FIG. 3 is a circuit diagram of a ladder filter according to a second preferred embodiment of the present invention. In a ladder filter 21, the series arm resonators S11 to S13 and the parallel arm resonators P11 to P15 are connected in the same or substantially the same manner as that for the ladder filter 1. The second preferred embodiment differs from the first preferred embodiment in that the first end of the first parallel arm 11 is connected to the antenna terminal 2 with the fourth inductor L4 disposed therebetween, and the first end of the third parallel arm 13 is connected to the reception terminal 3. As in this case, the first end of one of the inductors L1 and L2 whose second ends are connected in common to each other may be connected to the antenna terminal 2.

In this case, the second attenuation pole can be provided by the LC resonant circuit of the combined inductor of the first and second inductors L1 and L2 and the capacitor C1.Therefore, sufficient attenuations can be ensured in a plurality of attenuation ranges, similar to the ladder filter 1.

The frequency position of the attenuation pole can also be easily adjusted by adjustment of the inductance values of the first and second inductors L1 and L2 and the capacitance value of the capacitor C1. Moreover, the attenuation pole can also be positioned in a lower frequency range further remote from the pass band.

The LC resonant circuit may further include at least one fifth inductor L5 whose second end is connected in common to the second ends of the first and second inductors L1 and L2, as illustrated in broken lines in FIG. 1. The fifth inductor L5 is provided in at least one fourth parallel arm 14.

The numbers of the series arm resonators S11 to S13 and the parallel arm resonators P11 to P15 and the numbers of stages in the ladder filter are not limited to any specific number.

Figure 4:
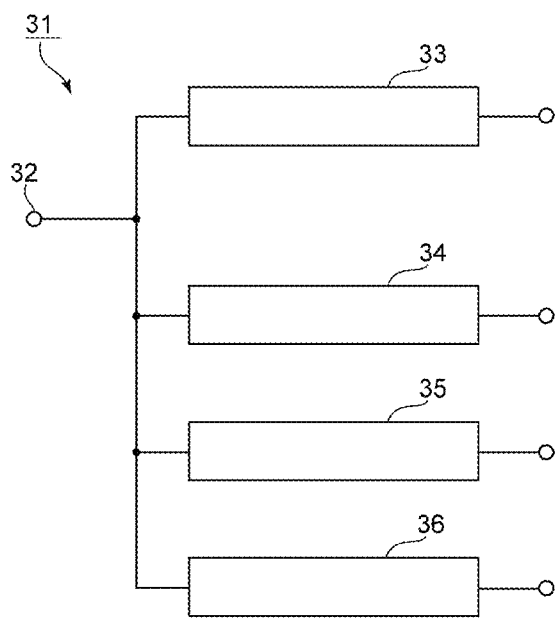
FIG. 4 is a circuit diagram of a composite filter device including a ladder filter according to a preferred embodiment of the present invention.

FIG. 4 is a circuit diagram of a composite filter device including a ladder filter according to a preferred embodiment of the present invention. In a composite filter device 31, first ends of first, second, third, and fourth band-pass filters 33, 34, 35, and 36 are connected in common to an antenna terminal 32. In this case, a ladder filter according to a preferred embodiment of the present invention can be suitably used as at least one band-pass filter. In particular, when the second and third band-pass filters 34 and 35 have their pass bands in frequency ranges lower than the pass band of the first band-pass filter 33, a ladder filter according to a preferred embodiment of the present invention can be suitably used as the first band-pass filter 33.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A composite filter device comprising:
    a plurality of band-pass filters including first ends connected in common to each other, the plurality of band-pass filters including a first band-pass filter including a ladder filter, the ladder filter including:
      series arm resonators in a series arm connecting a first terminal and a second terminal;
      a first inductor in a first parallel arm;
      a second inductor in a second parallel arm, the first parallel arm and the second parallel arm being included in a plurality of parallel arms connecting the series arm and a ground potential; and
      parallel arm resonators in parallel arms, respectively, of the plurality of parallel arms and different from the first and second parallel arms; wherein
    second end portions of the first inductor and the second inductor nearer to the ground potential than first end portions of the first inductor and the second inductor are connected in common;
    the ladder filter further includes a capacitance connected between the ground potential and a section where the first inductor and the second inductor are connected in common;
    at least two of the parallel arm resonators are connected between the first and second inductors; and
    the plurality of band-pass filters include second and third band-pass filters with pass bands lower than a pass band of the first band-pass filter.

2. The composite filter device according to claim 1, wherein second end portions of at least two of the parallel arm resonators nearer to the ground potential than first end portions of the first inductor and the second inductor are connected in common.

3. The composite filter device according to claim 1, wherein the first end portions of the first inductor and the second inductor are nearer to the series arm than the second end portions of the first inductor and the second inductor and are electrically connected to the series arm without the parallel arm resonators therebetween.

4. The composite filter device according to claim 1, further comprising a third inductor in at least one third parallel arm connected between the series arm and the ground potential.

5. The composite filter device according to claim 1, wherein the first end portion of the first inductor is electrically connected to the first terminal without the series arm resonators therebetween.

6. The composite filter device according to claim 1, wherein the first terminal is a reception terminal, the second terminal is an antenna terminal connected to an antenna, and the ladder filter defines a reception filter.

7. The composite filter device according to claim 1, further comprising a fourth inductor in the series arm and connected to the second terminal.

8. The composite filter device according to claim 7, wherein an end of the first parallel arm is connected to the second terminal with the fourth inductor disposed therebetween.

9. A composite filter device comprising:
a plurality of band-pass filters including first ends connected in common to each other, the plurality of band-pass filters including a first band-pass filter including a ladder filter, the ladder filter including:
series arm resonators in a series arm connecting a first terminal and a second terminal;
a first inductor in a first parallel arm;
a second inductor in a second parallel arm, the first parallel arm and the second parallel arm being included in a plurality of parallel arms connecting the series arm and a ground potential; and
parallel arm resonators in parallel arms, respectively, of the plurality of parallel arms and different from the first and second parallel arms; wherein
second end portions of the first inductor and the second inductor nearer to the ground potential than first end portions of the first inductor and the second inductor are connected in common;
the ladder filter further includes a capacitance connected between the ground potential and a section where the first inductor and the second inductor are connected in common;
the first end portions of the first inductor and the second inductor are nearer to the series arm than the second end portions of the first inductor and the second inductor and are electrically connected to the series arm without any parallel arm resonators therebetween, and the second end portions of the first inductor and the second inductor are connected to the ground potential without any parallel arms resonators therebetween; and
the plurality of band-pass filters include second and third band-pass filters with pass bands lower than a pass band of the first band-pass filter.

* * * * *